(12) United States Patent
Forrester (10) Patent No.: US 6,933,788 B2
(45) Date of Patent: Aug. 23, 2005

(54) REFERENCE OSCILLATOR

(75) Inventor: Tim Forrester, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 652 days.

(21) Appl. No.: 09/859,853

(22) Filed: May 16, 2001

(65) Prior Publication Data

US 2002/0173284 A1 Nov. 21, 2002

(51) Int. Cl.[7] .............................. H04B 1/06; H04B 7/00
(52) U.S. Cl. ...................... 331/1 R; 455/255; 455/259; 455/192.2; 331/18
(58) Field of Search ................... 455/63.1, 76, 182.2, 455/192.2, 255, 259, 316, 230, 317, 334, 258; 331/1 R, 16, 18, 30

(56) References Cited

U.S. PATENT DOCUMENTS

| | | | | |
|---|---|---|---|---|
| 5,335,354 A | * | 8/1994 | Koike ...................... 455/192.2 |
| 5,493,710 A | * | 2/1996 | Takahara et al. .......... 455/192.2 |
| 5,649,320 A | * | 7/1997 | Korhonen et al. ........ 455/196.1 |
| 5,740,525 A | * | 4/1998 | Spears ......................... 455/259 |
| 5,875,388 A | * | 2/1999 | Daughtry et al. ......... 455/67.11 |
| 6,064,270 A | | 5/2000 | Douglas ..................... 331/1 R |
| 6,157,260 A | * | 12/2000 | Tilley et al. .................... 331/2 |
| 6,249,155 B1 | * | 6/2001 | Hartman et al. ............. 327/106 |
| 6,345,172 B1 | * | 2/2002 | Hirai et al. .................... 455/76 |
| 6,748,199 B2 | * | 6/2004 | Nakano ................... 455/192.2 |

* cited by examiner

Primary Examiner—Simon Nguyen (57) ABSTRACT

A receiver uses an adaptive algorithm to tune a low-cost crystal oscillator according to a temperature compensation profile so as to produce a precision master reference frequency despite temperature, initial tolerance, and aging effects. An automatic frequency control system also tunes the crystal oscillator. The adaptive algorithm adjusts the temperature compensation profile for the crystal oscillator according to the adjustments made by the automatic frequency control should a received signal's quality factor exceed that associated with the temperature compensation profile.

25 Claims, 4 Drawing Sheets

REFERENCE OSCILLATOR

BACKGROUND

1. Field of the Invention

The present invention relates to electronic circuitry, and more specifically to electronic circuitry tuning a reference oscillator.

2. Description of Related Art

Because the usable electromagnetic spectrum is a limited resource, governmental agencies regulate its use and exploitation. For example, in the U.S. the Federal Communication Commission (FCC) divides the usable electromagnetic spectrum into frequency ranges, or bands. Each band may be assigned to a specific function, or may be reserved for future use. Since only a few bands are allocated to a specific function, such as portable communication, it is important that the band be efficiently utilized.

Thus, the frequency bands assigned to wireless communications should accommodate many wireless users. To allow each frequency band to accommodate so many users, a wireless communication device typically uses a reference oscillator to accurately find the carrier frequency used by its particular base station. In a particular use, the wireless device is a mobile handset configured to communicate with one or more base stations.

To find the carrier frequency, reference oscillators operating in a wireless communications device typically generate a highly accurate frequency reference. Because low-cost oscillators are prone to substantial initial error, large individual variations, and degraded performance over time, they have not been used to generate such an accurate frequency reference. Accordingly, known wireless communication devices use more expensive high-precision reference oscillators, and associated precision circuitry, to obtain the necessary accuracy and repeatability.

The precision circuitry in the wireless communication device or mobile handset generally includes a voltage-controlled temperature-compensated crystal oscillator (VC-TCXO). The VC-TCXO provides a reference frequency, which is used by the handset to find, or lock onto the carrier frequency. Depending upon the handset's current temperature, the VC-TCXO adjusts its tuning to maintain a constant reference frequency output. Such VC-TCXO's, however, are relatively expensive, adding significantly to the cost of a handset. Moreover, despite a VC-TCXO's expense, the reference frequency output eventually drifts with age. In addition, VC-TCXOs typically have an indeterminate initial accuracy resulting from manufacturing tolerances that complicates a handset's design.

Further, conventional temperature compensation circuitry for a VC-TCXO has degraded accuracy at temperature extremes. Despite this degraded accuracy, users expect a handset to provide reliable communication that mimics or betters that of a landline phone. To meet expectations, the handset must consistently establish communication in an acceptable time period and do so over a receiver's wide temperature range. For example, a handset is expected to operate in sub-Arctic conditions, and also operate after being subject to the torturous heat of a car dashboard in summer. As a result, it is desirable that a handset VC-TCXO should typically maintain a frequency accuracy of better than about +/−2 parts per million (ppm) over the temperature range −30° C. to +85° C.

As generally described earlier, a VC-TCXO is not stable over time. VC-TCXO modules may drift at approximately 1 ppm per year, yet are often expected to operate for many years. The typical AFC (Automatic Frequency Control) loop used to tune the VC-TCXO modules can cope with offsets of no greater than about +/−4 ppm with respect to its desired reference frequency. Thus, in just a few years, such VC-TCXO modules will have drifted to the point that they may not be able to assist in acquiring or capturing a base station's carrier.

Systems have been developed to account for the aging of a VC-TCXO. For example, U.S. Pat. No. 6,064,270 discloses a handset having a VC-TCXO that, should the base station's beacon carrier escape capture, will perform a random search for the carrier by adjusting the VC-TCXO's reference frequency +/−4 ppm (or some other suitable amount). If the carrier is acquired, the offset is remembered for future use. Although this system may provide acceptable age compensation when coupled with an expensive VC-TCXO, it is not practically implemented with less expensive oscillators having more substantial drift and corresponding large offsets. A system having such large offsets that searched blindly for the carrier frequency would produce delays intolerable to the user. In addition, the search accounts only for the gross offsets encountered during aging and does not address temperature effects, necessitating the continued use of an expensive VC-TCXO.

Accordingly, there is a need in the art for an improved receiver capable of providing a reference frequency that is robust to temperature and aging effects without the use of an expensive VC-TCXO.

SUMMARY

It is desirable to accurately generate a reference frequency signal using a low-cost oscillator. It is therefore an object of the invention to enable low-cost oscillators to accurately generate reference signals despite initial tolerance, temperature and aging effects. It is a further object of the invention to enable such oscillators to adaptively adjust to temperature and aging effects by recalibrating accordingly.

To overcome the disadvantage in the prior art and meet the objectives of this invention, a computational device implements an adaptive algorithm. The adaptive algorithm adjusts stored frequency correction information to compensate a reference oscillator. During this compensation, the reference oscillator adjusts its master reference signal responsive to the stored frequency correction information. Because this algorithm adaptively accounts for initial frequency error, aging, and temperature effects, a low-cost VCXO may be used as the reference oscillator.

In accordance with one aspect of the invention, the frequency correction information comprises a plurality of predetermined frequency correction factors spanning a temperature range. The computational device may receive current temperature information, which enables the computational device to derive a current frequency correction factor from the frequency correction factors. The reference oscillator tunes or adjusts the frequency of its reference signal according to the current frequency correction factor. Should the reference signal frequency be offset from a desired frequency, the computational device may adjust one or more of the stored frequency correction factors according to the frequency offset. In such a manner, the stored correction factors are adjusted as needed to provide superior frequency accuracy.

Quality factors may be associated with the frequency correction factors. In this embodiment, when a current frequency correction factor is calculated, a current quality factor is also determined from the quality factors. A received signal's quality factor is compared to the current quality factor before the temperature correction factors are updated. In such a manner, an older, but higher quality temperature compensation factor would not be replaced by a newer, but lower quality temperature compensation factor.

Advantageously, the present invention enables a communications device to use a low-cost oscillator as a reference oscillator, avoiding the cost of the VC-TCXO. Because the invention provides for adaptive adjustment of the frequency correction factors, the low cost oscillator also systematically compensates for oscillator aging.

Further aspects and features of the invention are set forth in the following description together with the accompanying drawings.

BRIEF DESCRIPTION OF THE DRAWINGS

Use of the same reference symbols in different figures indicates similar or identical items.

DETAILED DESCRIPTION

Figure 1:
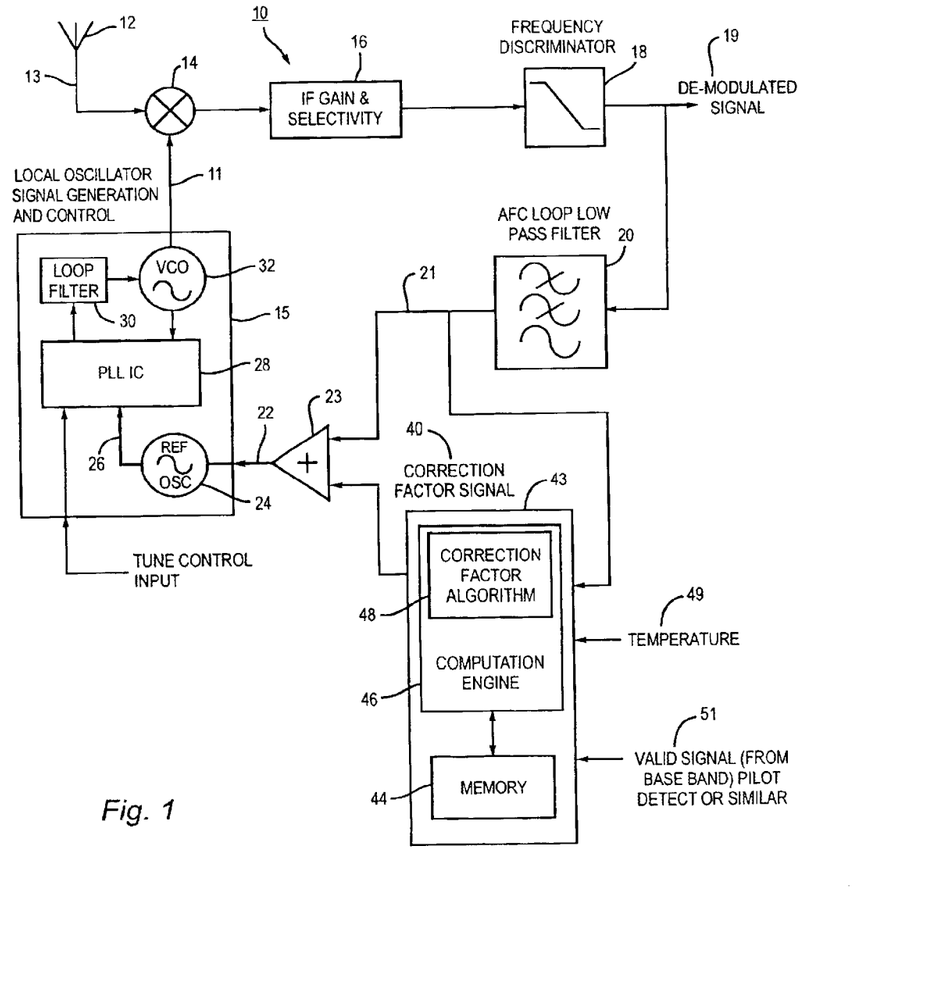
FIG. 1 illustrates a receiver having an adaptive VC-TCXO correction loop according to one embodiment of the invention.

Referring now to FIG. 1, a block diagram is shown of a receiver 10 using a low-cost reference oscillator 24. Despite being low cost, the reference oscillator 24 generates a precision reference frequency signal 26 of sufficient accuracy for wireless communication. Since the receiver 10 does not require an expensive VC-TCXO, the receiver 10 is desirable for use in a wireless communications device such as a mobile handset.

In the illustrated example, the receiver 10 is a super heterodyne receiver 10 that adaptively accounts for initial frequency error, temperature effects and aging drift of the low precision oscillator 24. More specifically, the receiver 10 incorporates a logic block 43 to remember, predict, and adapt frequency correction information. The frequency correction information may be stored in a memory 44 in analog or digital form. In digital form, the frequency correction information may be sampled to create a plurality of temperature correction factors. These correction factors may be responsive to temperature fluctuations, initial error conditions, and aging effects, for example. Accordingly, the low cost oscillator 24 provides a sufficiently repeatable and accurate frequency signal for use in the local oscillator block 15.

Before proceeding to discuss the logic block 43, the receiver 10 will be generally described. The receiver 10 includes an antenna 12 that receives a transmitted signal such as a base station carrier signal. The antenna signal 13 is down converted with a local oscillator (LO) signal 11 in a mixer 14 to form an intermediate frequency (IF) signal 34. The generation of the LO signal 11 by the local oscillator block 15 will be described further herein.

An IF gain and selection block 16 amplifies and filters the IF signal 34 produced by the mixer 14. A frequency discriminator 18 frequency demodulates the amplified and filtered IF signal to produce a demodulated signal 19. The demodulated signal 19 is low-pass filtered by an automatic frequency control (AFC) loop filter 20 to form an AFC signal 21. The AFC signal 21 couples to the reference oscillator 24 to tune the frequency of the reference signal 26. The reference signal couples to a phase-locked loop (PLL) 28 that is part of the local oscillator block 15. A loop filter 30 then couples the PLL output to a voltage-controlled oscillator (VCO) 32 that produces the LO signal 11.

Those of ordinary skill in the art will appreciate that the receiver 10 of FIG. 1 is an idealized version for use in a wireless handset. In an actual handset receiver, multiple frequency translations may require additional mixing stages. Furthermore, AFC loop filter 20 may include I and Q channels (not illustrated). The I and Q signals so produced may be digitized and processed before being filtered by the AFC loop filter 20. The receiver's logic block 43 will now be described.

The logic block 43 includes a computation engine 46, which implements an adaptive algorithm 48 that self-learns and accounts for initial error conditions and temperature and aging effects of the reference oscillator, enabling the receiver 10 to capture signals without requiring the use of precision TC-VCXOs. The computation engine 46 provides a current correction factor 40 according to the algorithm 48. Those of ordinary skill in the art will appreciate that algorithm 48, unlike the remaining elements in FIG. 1, is not structure but is shown symbollically to indicate its relationship to the receiver 10. The correction factor 40 may compensate for initial tolerance error, aging effects, and current temperature, for example. The computation engine 46 may be implemented using any suitable logic device that may be programmed to produce this factor 40, including a microprocessor (not illustrated) or a state machine (not illustrated). Logic block 43 also preferably includes a memory device 44. It will be appreciated that the memory device 44 may be alternatively integrated with the computational device 46.

The current temperature correction factor 40 is combined with the AFC signal 21 in summer 23 to produce a reference oscillator correction signal 22. This reference oscillator correction signal 22 couples to the LO oscillator block 15 to adjust the LO signal 11. In this manner, the receiver 10 has both "coarse" and "fine" control of its master reference signal 26 and, ultimately, the LO signal. The coarse control is provided by the logic block 43 through the current temperature correction factor 40. The coarse control is desirably operated so that the fine control provided by the AFC loop can capture the transmitted signal, typically requiring the coarse control to be within about +/−4 ppm of the required frequency. In this fashion, the coarse control provided by the logic block 43 effectively enables the low cost VCXO to provide a level of performance conventionally provided by the more expensive precision TC-VCXO. However, unlike receivers using conventional TC-VCXOs, the receiver 10 continually recalibrates the low cost VCXO as mandated by changes in temperature and aging.

The adaptive algorithm 48 uses a predetermined frequency offset profile specific to whatever VCXO is used as the reference oscillator 24. This profile provides the frequency compensation necessary to adjust the reference oscillator 24 over its operating temperature range. Thus, the frequency offset profile may also be denoted as the temperature compensation profile.

Figure 2:
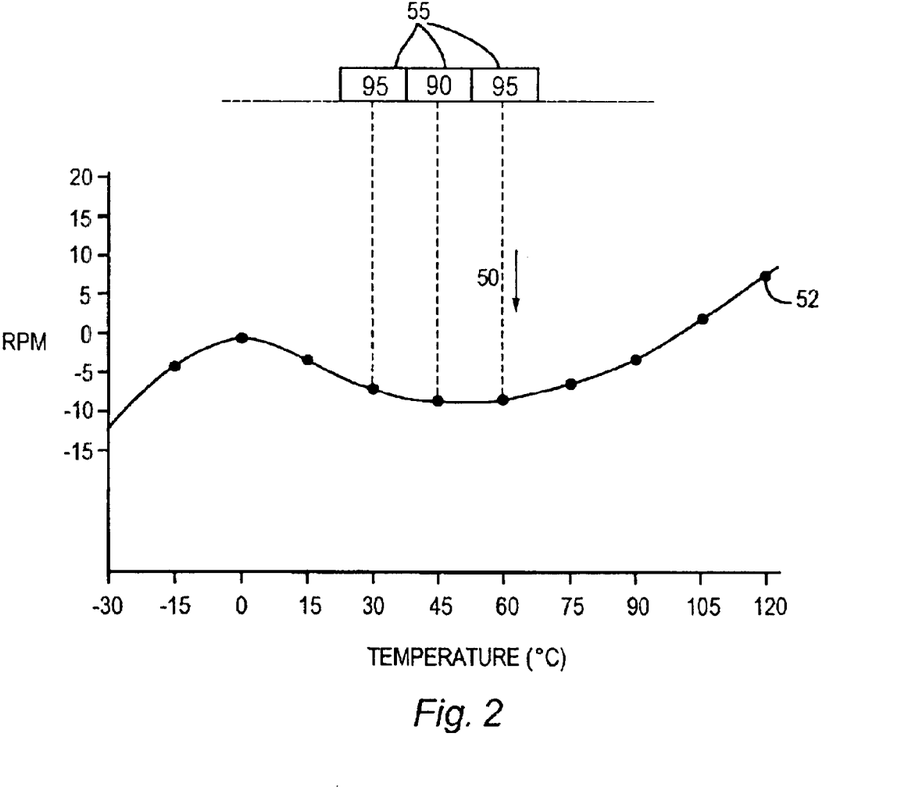
FIG. 2 illustrates the temperature correction profile for a VCXO.

Referring to FIG. 2, an illustrative profile 50 for a low-cost oscillator is shown. Several techniques may be employed to derive the profile 50 to account for the component-to-component variances of low-cost VCXOs. In one embodiment, a given VCXO would be individually tested over the expected receiver's temperature range to calibrate the profile 50 exactly to the VCXO's particular behavior. Such individual testing could, however, increase manufacturing costs and reduce the savings introduced by using a low-cost VCXO in place of a precision TC-VCXO. Thus, in another embodiment, rather than test a given VCXO over the entire expected operating range, each VCXO would be initially calibrated only at a single ambient temperature. Prior to this calibration, the expected profile may be determined from manufacturer data, typically representing the averaging of many individual VCXOs. The expected profile is, as the name implies, only expected and may be departed from considerably by a given individual VCXO. For example, 10 ppm variances can be observed from the expected profile predicted by a given VCXO manufacturer. For a given VCXO, the manufacturer will generally publish a data sheet indicating an expected frequency offset profile. Alternatively, such a profile may be derived by averaging the test results of several VCXOs from a given batch over the expected receiver's temperature range (typically −30° to +120° C.).

It will be appreciated that, given the large component-to-component tolerances expected for a low-cost VCXO, the actual temperature compensation profile may vary widely from individual VCXO to VCXO, even within the same manufacturer batch. Thus, it is desirable that the profile 50 be individually calibrated for a given VCXO because of the wide tolerance. Given that the receiver will usually be at ambient temperature and this temperature is normal for a manufacturing plant, the individual calibration may be performed at ambient temperature. It will be appreciated that another temperature may be selected for calibration purposes.

Prior to calibration, data indicative of the profile 50 may be placed in memory by storing samples 52 of the profile in a non-volatile memory 44. Each sample 52 corresponds to a discrete temperature and its associated frequency offset/temperature compensation value. Accordingly, the samples 52 represent initial temperature correction factors.

The temperature correction factors 52 of the offset profile 50 may be taken at regular temperature intervals as shown. Alternatively, the profile 50 may be sampled more in regions where the slope is changing and less in regions of relatively little slope change. A thermistor (not illustrated in FIG. 1) or another suitable temperature-sensing device provides the receiver's temperature 49. The logic block 43 may correlate a subset of the temperature correction factors 52 with the receiver's temperature 49 to provide a current correction factor signal 40. In operation, if the receiver's temperature matches the temperature corresponding to one of the temperature correction factors 52, the "correlation" would comprise merely using the frequency offset of the matched factor 52 as the current correction factor signal 40. In such a case, the subset of samples used for correlation has just one member.

More typically, however, the receiver's temperature will not correspond to any of the temperatures used for the temperature correction factors 52. One simple way to correlate the receiver's temperature in this case is to assume a linear slope between adjacent samples immediately framing the receiver's temperature. For example, suppose the receiver's temperature is 90° C. and the two closest temperature correction factors give a value of +10 ppm at 100° C. and +5 ppm at 80° C. Assuming a linear slope between these two temperature corrections factors would give the current correction factor as 7.5 ppm corresponding to the receiver's temperature of 90° C. In such a case the subset of samples used for correlation has two members. Alternatively, three or more samples may be used to predict a quadratic or higher order slope for the profile 50 at the receiver's temperature.

Given this expected profile 50, an individual VCXO may be calibrated at ambient temperature with a powerful transmitted signal to ensure that the receiver will capture the transmitted signal with its AFC loop. As discussed earlier, a conventional AFC loop can only handle approximately about +/−4 ppm in frequency offset at typical operating signal-to-noise ratios. However, these conventional AFC loops can accommodate larger offsets such as +/−10 ppm should the signal-to-noise ratio be unusually large. Such a situation occurs when a mobile user is close to the transmitting base station or, in this case, receiving a beacon frequency in a laboratory or manufacturing setting. Thus, even if a VCXO being calibrated is off 10PPM from its expected profile at ambient temperature, the AFC loop will be able to capture the signal given a high enough signal-to-noise ratio—an occurrence easily established in a controlled setting.

To begin the calibration, the logic block 43 correlates the receiver's temperature 49 with a subset of the temperature correction factors 52 in the manner just described to produce a current temperature correction factor 40. The reference oscillator 24 tunes accordingly and the AFC loop filter 20, if necessary, produces an AFC signal 21 to capture the transmitted signal. For example, if the reference signal's frequency is too high, the AFC signal 21 tunes the reference oscillator 24 to lower the frequency of the reference signal 26. Conversely, if the reference signal' frequency is too low, the AFC signal 21 tunes the reference oscillator 24 to increases the frequency of the reference signal 26. In either case, the reference signal 26 has a frequency offset from that of a desired frequency as determined by the base station's carrier frequency. The resulting AFC signal 21 corresponding to this frequency offset may be used to recalibrate the expected profile to produce an adjusted profile. In other words, the AFC signal 21 correlates with a certain ppm frequency offset.

Figure 3:
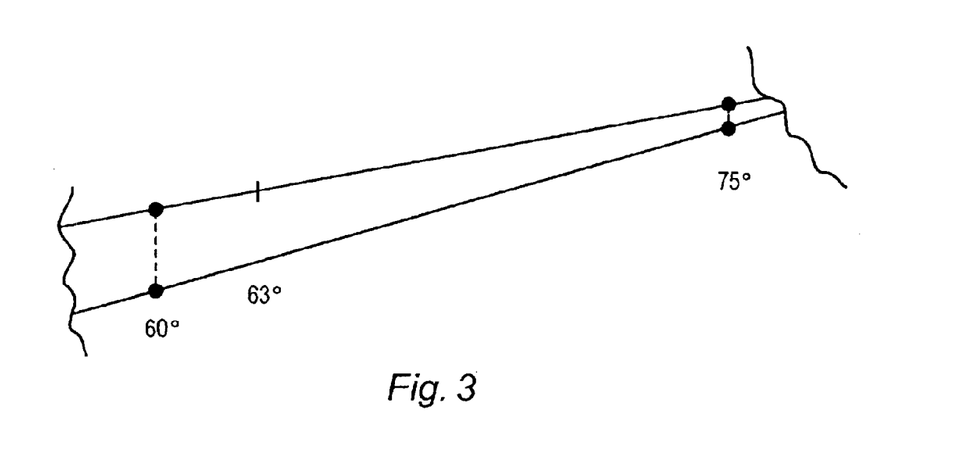
FIG. 3 illustrates a portion of the profile of FIG. 2 being calibrated according to one embodiment of the invention.

This frequency offset, whether positive or negative, may be applied to calibrate the subset of the temperature correction factors within the expected profile. For example, if the AFC signal 21 used to capture the manufacturing signal during calibration at ambient temperature correlates to a +10 ppm frequency offset, the subset of samples used for correlation may be calibrated by adding 10 ppm to each sample in the subset. Alternatively, the subset may be calibrated linearly according to their contribution to the initial correlation as seen in FIG. 3. Here, the receiver's temperature is 63° C. thus requiring an 80% contribution from the temperature correction factor at 60° and a 20% contribution from the temperature correction factor at 75°, assuming a linear correlation. If the resulting AFC signal 21 corresponds to a +10 ppm shift, then the temperature correction factor at 60° would be shifted up 8 ppm and the temperature correction factor at 75° would be shifted up 2 ppm to calibrate the subset.

In addition, should this initial calibration result in a sufficiently large shift, such as the 8 ppm discussed with respect to FIG. 3, all of the remaining temperature correction factors may be shifted accordingly, for example, by shifting 1 ppm. As discussed, the value of the AFC signal 21 correlates to a frequency offset. The computation engine 46 receives the AFC signal 21 and may correlate this signal to the corresponding frequency offset using a lookup table.

Alternatively, the current temperature correction factor 40 may be adjusted by the computation engine 46 until the AFC signal 21 is minimized or "zeroed out." At this point, the current temperature correction factor 40 accounts for and eliminates the frequency offset. Assuming that ambient temperature is used for this initial calibration, the profile 50 may have a temperature correction factor 52 at ambient temperature to eliminate any requirement to correlate with more than one temperature correction factor 52 to derive the current temperature correction factor 40 (the subset of factors used would have just one member).

To distinguish the factors 52 that are calibrated accurately from those that are not, each factor 52 may be assigned a quality factor 55 having an arbitrary scale such as from 1 to 100. The quality factor 55, as the name implies, relates to the quality of the received signal used to calibrate the receiver as determined, for example, by the signal-to-noise ratio. Alternatively, the quality factor may relate to an automatic gain control signal as determined by the received signal, the carrier-to-noise ratio, or another suitable factor relating to the quality of the received signal. For the profile shown in FIG. 2, the temperature correction factor for 30° is associated with a quality factor of 95, the temperature correction factor for 45° is associated with a quality factor of 90, and the temperature correction factor for 60° is associated with a quality factor of 95.

Before the initial calibration, all the temperature correction factors 52 would be associated with a low quality factor, e.g., a value of 50. After the initial calibration, the subset of temperature correction factors 52 that are calibrated as discussed with respect to FIG. 3 are assigned a high quality factor such as a value of 100 because the transmitted signal in this laboratory setting is such that a very high signal-to-noise ratio is assured within the receiver. Note that in a situation such as illustrated in FIG. 3, the quality factors associated with the temperature correction factors 52 within the subset may be updated proportionally to their contribution to the current temperature correction factor 40.

Alternatively, should the subset consist of just one member corresponding to the calibration temperature, just this factor would receive the high quality factor.

Because the initial calibration typically occurs at ambient temperature, the receiver's temperature will tend to change gradually from ambient if the receiver is moved, for example, from indoors to an outdoors location during use by a consumer. As the receiver heats or cools, the receiver's temperature will correlate with temperature correction factors 52 that were not initially calibrated. Thus, the receiver "self-learns" or adaptively adjusts these factors 52, using the transmitted signal as a frequency reference.

As in the initial calibration, the receiver's temperature is correlated with a subset of the temperature correction factors 52 to produce a current temperature correction factor 40. The transmitted signal is then captured by the receiver's AFC loop. Should the AFC signal 21 indicate a frequency offset is present, the subset is calibrated in the manner just described with respect to FIG. 3. In a wireless receiver, the reference oscillator thus becomes locked to the base station's transmitted frequency. Note, however, that because this calibration is occurring outside the initial calibration conditions on a real-world transmitted signal, there is a danger that the receiver could calibrate improperly on a noisy transmitted signal. Thus, the computation engine 46 may respond to a valid signal indication 51. In a mobile handset, the computation engine 46 may use the identification of the pilot signal or some other suitable traffic indication to serve as the valid signal indication 51.

Having assured itself that the received signal is valid, the computation engine may then calculate the quality factor of the received signal. For example, the logic block 43 may have a lookup table that correlates the current carrier-to-noise ratio of the received signal to a quality factor on the scale of 1 to 100. This received quality factor is compared to the quality factor as given by the subset of temperature correction factors 52 used to derive the current temperature correction factor 40. If the received quality factor is greater, the subset is calibrated as discussed with respect to the initial calibration. However, because the received quality factor will not necessarily equal 100 as in the initial calibration, the amount by which the subset would be updated according to the frequency offset may be reduced proportional to the received quality factor. For example, should the frequency offset correlate to a 10 ppm update of the subset and the received quality factor is 90, then just 90% of the 10 ppm may be applied to the subset. In this fashion, the stored temperature correction factors 52 become progressively more accurate as the receiver adapts to shifts in receiver's temperature. It will be appreciated that other methods may be used to proportionally apply the frequency offset.

As the reference oscillator 24 ages, its expected profile 50 may change as well. To compensate for this aging effect, the quality factors associated with the temperature correction factors 52 may be systematically decreased over time. For example, should the quality factors correspond to a scale of 1 to 100, the quality factors could be reduced by 5 every three months. In this fashion, the temperature correction factors 52 will be more readily recalibrated as time passes so as to account for aging effects. The rate at which the quality factors are reduced to account for this aging depends upon the characteristics of the individual reference oscillator 24 within a given receiver.

Note that once calibrated, even low-cost VCXOs exhibit little hysteresis such that repeated use of the receiver at the same temperature with the same current temperature correction factor 40 will result in signal capture with little additional offset needed from the AFC correction signal 21. Thus, the adjustment of the quality factors to account for aging may be very gradual.

Because the receiver may experience extremes in temperature without prior calibration, there is the possibility that the "fine" control provided by the AFC loop will be unable to capture the transmitted signal, despite the "coarse" control provided by the logic block 43 via the current temperature correction factor 40. In such a situation, the logic block 43 may be configured to search for the transmitted signal by incrementing or decrementing the current temperature correction factor 40. The required increment will depend upon the amount of fine control provided by the conventional AFC loop. For example, if this AFC loop can accommodate frequency errors of +/−4 ppm in the master reference signal 26, the increment or decrement should be not greater than 4 ppm. Rather than search blindly, the logic block 43 stores the cumulative record of positive or negative calibrations of the temperature correction factors 52. If the receiver's temperature correlates with a certain temperature correction factor that has been recalibrated with positive increments in ppm several times, it would be logical to then assume that the required increment in the current temperature correction factor 40 should be positive rather than negative.

In addition, the logic block 43 can gauge the scale of the increment by this history. For example, should the recent recalibrations have all been significant (such as greater than 5 ppm), the usual increment in the current temperature correction factor could be increased from, say, 4 ppm to 5 ppm. The logic block 43 may store other parameters relating to the history of the calibrations for diagnostic purposes. These parameters include the time of each calibration and the number of times each temperature correction factor 52 has been updated.

Figure 4:
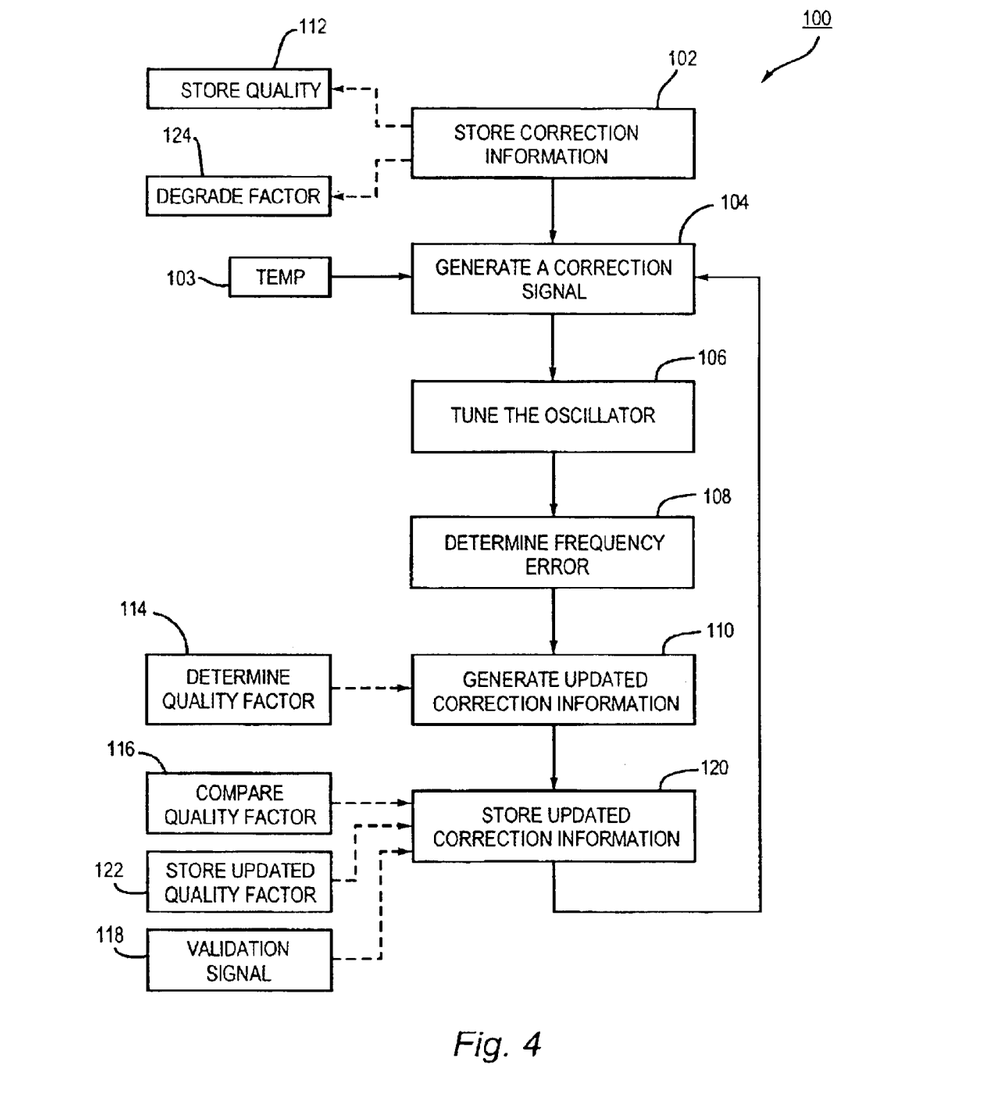
FIG. 4 is a flowchart of a method for providing a reference signal in accordance with one embodiment of the invention.

Referring now to FIG. 4, a method 100 of calibrating the stored frequency correction information is shown. The method 100 is preferably implemented on a communications device, for example, a mobile wireless handset. It will be appreciated that method 100 may be used on a wide variety of communications equipment.

Method 100 initially stores a frequency offset or temperature compensation profile in a memory in the communications device, as shown in block 102. As described earlier, the frequency offset profile may be in the form of discrete temperature compensation factors or be in analog form. Alternatively, the profile may be approximated by a polynomial function and the necessary polynomial coefficients stored in memory. Optionally, a quality factor may be associated with the correction information as previously described. As shown in block 112, the quality factor may also be stored in the communications device.

A current temperature signal is provided in block 103. It will be appreciated the current temperature may be detected by any of several well known devices, such as a thermister, and the temperature signal may take one of several known forms such as a voltage or current signal.

Responsive to the current temperature, a current correction signal corresponding to the current temperature is retrieved from the stored frequency correction information in block 104. Should the frequency correction information be stored as a plurality of temperature correction factors, the current temperature is correlated with a subset of the factors as described previously The correction signal tunes a reference oscillator in block 106. Ideally, the tuning performed in block 106 tunes the oscillator to precisely the desired frequency. More often, however, a frequency error in the tuning of the reference oscillator may be detected in block 108. Such an error may be detected and measured in an AFC loop, for example.

The determined frequency error is used in block 110 to generate updated frequency correction information for the current temperature. In one implementation, the method 100 also determines the quality of the signal received according to the tuning of the reference oscillator as shown in block 114. For example, this received quality factor may relate to the strength or signal to noise ratio of the received signal. It will be appreciated that other factors may be used to determine the received quality factor.

In block 116, the received quality factor determined for the updated correction information may be compared to the quality factor associated with the stored frequency correction information used to derive the current correction signal. Responsive to this comparison, a decision can be made whether to proceed to store the updated correction information in block 120. For example, if the stored frequency correction information used to derive the current correction signal has an associated quality factor of 70, and the received signal has only an associated quality factor of 60, then the updated frequency correction information will not replace the better, although older, stored frequency correction information. On the other hand, when the received quality factor is better than the quality factor associated with the stored correction information used to derive the current correction signal, then the updated frequency correction information is stored in block 120. Also, the received quality factor is also associated with the updated correction information and stored, as shown in block 122.

It will also be appreciated that other factors may be used to determine when the updated correction information will be stored. Such factors may be used to reduce the risk that high quality frequency correction information will be replaced by false or low quality frequency correction information. For example, block 118 shows that a validation signal may be determine whether the updated correction information is stored. This validation signal indicates whether a valid signal is being received.

The validation signal may be generated, for example, when a predetermined signal is positively received and identified. In one specific example, the validation signal is generated when a pilot signal is confirmed. It will be appreciated that the generation of the validation signal may be responsive to other factors.

To account for aging effects, block 124 shows that the stored quality factors may be slowly degraded over time. In such a manner, even frequency correction information which had the highest quality factor may be subject to adjustment after a period of time.

Figure 5:
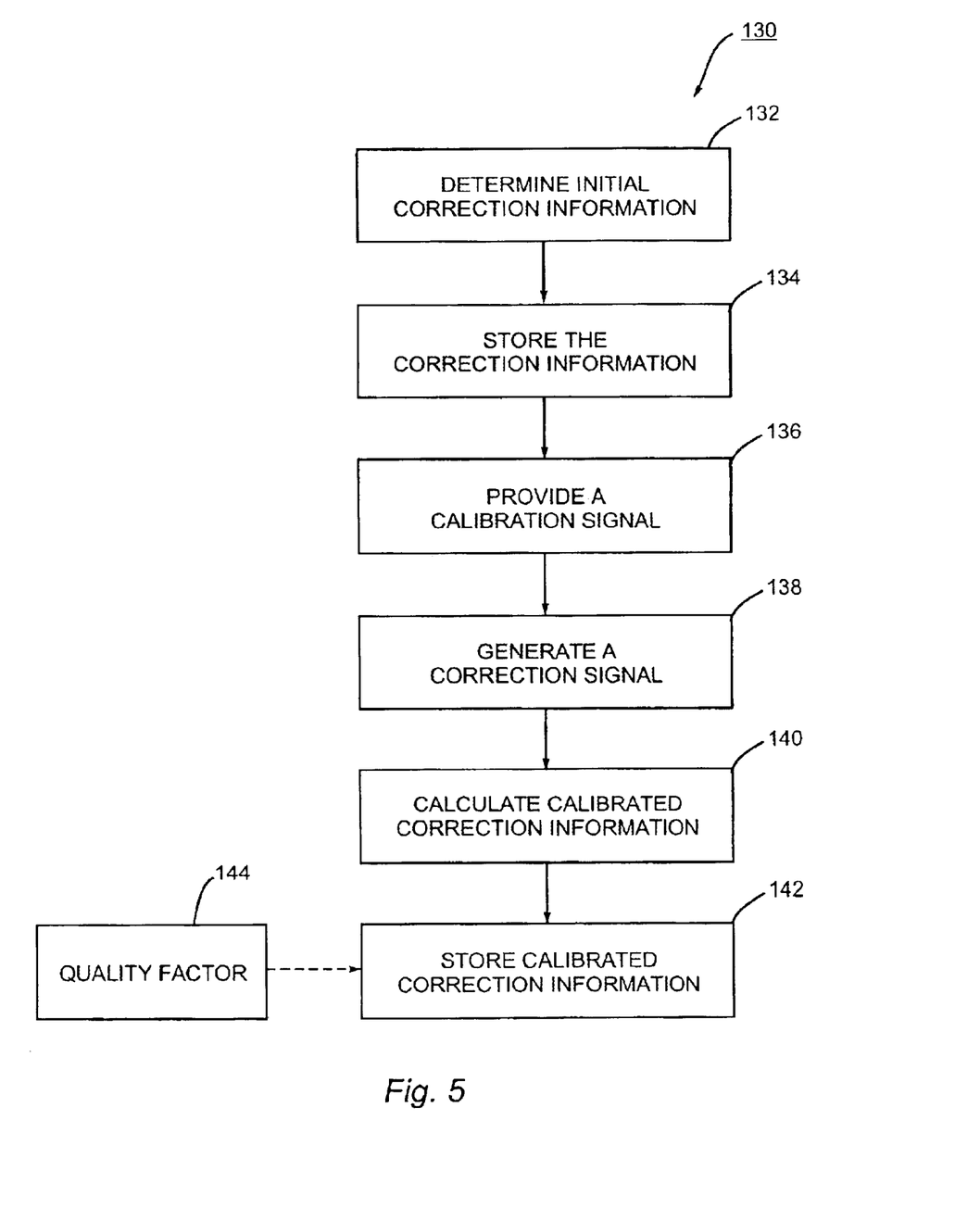
FIG. 5 is a flowchart of a method for calibrating a communication device in accordance with one embodiment of the invention.

Referring now to FIG. 5, a method 130 for initial calibration of a communications device configured to implement the method 100 of FIG. 4 is shown. In block 132, the initial frequency correction information for a reference oscillator is determined. As discussed previously, this determination may be based on manufacturer provided information. In block 134, this initial frequency correction information is stored in memory. Because of the large individual tolerances encountered with low-cost reference oscillators, this initial frequency correction information is only approximate and does not necessarily correspond to the behavior of a given individual reference oscillator. Thus, this initial frequency correction information should be calibrated according to the individual behavior of the reference oscillator being tested. To do so, a strong calibration signal is generated and the reference oscillator tuned according to the initial frequency correction information in block 136. As used herein, this "strong" calibration signal denotes a signal powerful enough to enable a conventional AFC loop to capture this calibration signal even if the reference oscillator has a large frequency offset, e.g., +/−10 ppm. To eliminate this frequency offset, updated or calibrated frequency correction information is generated in block 140. Finally, in block 142 this updated frequency correction information is stored. A quality factor may be associated with this stored information in block 144.

To better appreciate the contribution of the receiver 10, the operation of a conventional receiver will be briefly discussed. It will, however, be understood that conventional receiver operation is well known. In conventional prior art receivers, an AFC signal typically is directly coupled to an expensive high performance reference (or crystal) oscillator to provide an LO signal. In response to the AFC signal, the high cost reference oscillator adjusts the frequency of a master reference signal.

The master reference signal typically couples to a phase-locked loop (PLL) that is part of the local oscillator control block. A loop filter then generally couples the PLL to a voltage-controlled oscillator (VCO) that produces the LO signal. The LO signal mixes with the received signal from the antenna to produce an IF signal. This IF signal will be demodulated and passed through an AFC low pass filter, and feed back into the reference oscillator. Thereby a conventional AFC "loop" is formed.

Conventional AFC low pass filters are designed so that the AFC control provided is fast-acting and can correct +/−4 ppm frequency inaccuracies in the master reference signal. Should the high performance reference oscillator produce a master reference signal precisely at the required frequency, the AFC loop would never need to adjust the reference oscillator. However, even precision reference oscillators will tend to be slightly inaccurate and require adjustment by the AFC loop. As noted in the background section, conventional AFC loops could correct for about a +/−4 ppm deviation by the reference oscillator yet still acquire the carrier signal at typical operating signal-to-noise ratios.

Conventional control of the reference oscillator by using a precision TC-VCXO, however, could not adaptively adjust for temperature and aging effects experience by even the expensive, high performance reference oscillator. Advantageously, the receiver 10 enables a low cost reference oscillator to accurately and reliably provide a stable reference frequency by "locking on" to an accurate transmitted signal such as a base station's carrier frequency. Further, the receiver 10 adaptively adjusts to improve the reference oscillator's performance over time. It will be appreciated that the present invention need not use a manufactured low-cost VCXO module. For example, one could use discrete crystal and oscillator stages that are combined to form a low-cost VCXO solution. Moreover, a conventional high-cost VC-TCXO may still be used within the present invention and benefit from the adaptive aging and temperature compensation features.

The receiver described herein is suitable for all wireless protocols such as TDMA and CDMA. Moreover, although described with respect to a super heterodyne receiver, the present invention is widely applicable to other types of receivers that must tune a reference oscillator to capture a transmitted signal. For example, the present invention is applicable to direct conversion receivers.

Thus, although the invention has been described with reference to particular embodiments, the description is only an example of the invention's application and should not be taken as a limitation. Consequently, various adaptations and combinations of features of the embodiments disclosed are within the scope of the invention as encompassed by the following claims.

I claim:

1. A method of providing a reference frequency signal, comprising:
    associating a quality factor with frequency correction information;
    storing the frequency correction information for a reference oscillator;
    generating a frequency correction signal using the frequency correction information;
    tuning the reference oscillator using the frequency correction signal, the reference oscillator outputting the reference frequency signal;
    associating a received quality factor with a signal received according to the reference signal;
    determining a frequency error in the reference frequency signal;
    comparing the quality factor with the received quality factor; and
    modifying the frequency correction information responsive to the comparison.

2. The method according to claim 1, further comprising:
    storing updated frequency correction information responsive to the comparison.

3. The method according to claim 1, further comprising:
    determining whether the signal received according to the reference signal is a valid signal, wherein the storing the updated frequency correction information act is responsive to this determination.

4. A correction circuit for a receiver, comprising:
    a mixer configured to receive a transmitted signal and a local oscillator signal, the mixer configured to output an IF signal;
    processing circuitry configured to receive the IF signal and to output a demodulated signal;
    a low pass filter configured to receive the demodulated signal and output a filtered signal;
    a non-volatile memory configured to store frequency correction information and a quality factor associated with the frequency correction information;
    a summing circuit configured to receive the filtered signal and a correction factor signal, the summing circuit configured to output a correction signal;
    a reference oscillator configured to receive the correction signal, the reference oscillator configured to generate a reference signal that is used to generate the local oscillator signal;
    a computational device configured to receive a temperature signal and the filtered signal, the computation device performing the steps of:
        retrieving frequency correction information from the non-volatile memory responsive to the temperature signal;
        generating the correction factor signal using the retrieved frequency correction information;
    generating updated frequency correction information responsive to the filtered signal; and
    storing data indicative of the updated frequency correction information in the nonvolatile memory
        generating a received quality factor associated with the demodulated signal;
        comparing the received quality factor to the quality factor; and
        modifying the frequency correction information responsive to the comparison.

5. The correction circuit according to claim 4, wherein the computational device is configured to receive a validation signal, and generates the updated frequency correction information responsive to receiving the validation signal.

6. The correction circuit according to claim 4, wherein the computation device additionally performs the steps of:
    generating updated frequency correction information responsive to comparing the received quality factor with the quality factor; and
    storing data indicative of the updated frequency correction information.

7. A method of providing a reference frequency signal, comprising:
    storing discrete frequency correction factors for a reference oscillator;
    receiving current temperature data;
    determining a correction factor associated with the current temperature data by correlating the current temperature data with the discrete frequency correction factors;
    tuning a reference oscillator using the correction factor, the reference oscillator outputting the reference frequency signal;
    determining a frequency error in the reference frequency signal;

generating updated frequency correction information using the frequency error;

determining updated discrete frequency correction factors using the updated frequency correction information; and storing the updated discrete frequency correction factors;

associating a quality factor with at least one of the frequency correction factors;

determining a received quality factor associated with a signal received according to the reference signal;

comparing the quality factor to the received quality factor; and storing the undated discrete frequency correction factors responsive to the comparison.

8. The method according to claim 7, further comprising:

receiving a validation signal indicative of the presence of a valid signal; and storing the updated discrete frequency correction factors responsive to the validation signal.

9. A method of calibrating an oscillator in a communication device, comprising:

determining initial frequency correction information for the oscillator;

storing the initial frequency correction information in the communication device;

correlating the initial frequency correction information with a current temperature to generate a current correction signal;

tuning a reference oscillator in the communication device according to the current correction signal to generate a reference signal;

transmitting a strong signal to the communication device;

determining a frequency error in the reference signal according to the strong transmitted signal;

calculating calibrated frequency correction information that compensates for the frequency error;

storing the calibrated frequency correction information in the communication device; and associating a quality factor with the calibrated frequency correction information and storing the associated quality factor in the communication device.

10. A method of maintaining frequency accuracy for an oscillator in a communication device, comprising:

providing frequency correction information in the communication device;

generating a correction signal indicative of a frequency error at a current temperature, the correction signal for tuning the oscillator;

generating updated frequency correction information that compensates for the frequency error;

storing the updated frequency correction information in the wireless device;

associating a quality factor with the frequency correction information;

determining an updated quality factor for the undated frequency correction information;

comparing the quality factor to the updated quality factor; and storing the updated frequency correction information and updated quality factor responsive to the comparison.

11. A method for compensating a reference oscillator of a receiver, comprising:

storing a plurality of predetermined temperature compensation factors, each temperature compensation factor being associated with a quality factor;

correlating the receiver s temperature with a subset of temperature correction factors from the plurality to produce a current correction factor;

compensating the reference oscillator according to the current correction factor, the reference oscillator thereby producing a reference signal;

receiving a transmitted signal with the receiver tuned according to the reference signal to produce a received signal having a frequency offset; and adjusting the temperature compensation factors within the subset according to the frequency offset if the received signal's quality factor exceeds the quality factor associated with the subset.

12. The method of claim 11, further comprising:

storing the adjusted temperature compensation factors.

13. The method of claim 12, further comprising:

reducing the quality factors associated with the plurality of temperature compensation factors proportionally to the passage of time.

14. The method of claim 13, further comprising:

determining whether the transmitted signal is a valid signal, wherein the adjusting the temperature compensation factors within the subset act occurs only if the received signal is a valid signal.

15. The method of claim 14, wherein the determining act determines whether the transmitted signal is the pilot signal of a base station.

16. The method of claim 12, further comprising:

adjusting the reference oscillator according to an automatic frequency control signal to reduce the frequency offset.

17. The method of claim 16, wherein the automatic frequency control signal is produced by a low-pass filtering of the received signal.

18. The method of claim 12, wherein the receiving the transmitted signal according to the reference signal act occurs by mixing a signal whose frequency is proportional to the reference signal with the transmitted signal to produce the received signal having a frequency offset.

19. The method of claim 11, wherein the received signal's quality factor is determined according to a carrier-to-noise ratio.

20. A receiver, comprising:

a reference oscillator;

a automatic frequency control system coupled to the reference oscillator, wherein the automatic frequency control system controls the reference oscillator's frequency according to a frequency offset of a received signal;

a computation engine coupled to a memory storing a plurality of predetermined temperature correction factors spanning a temperature range, wherein each temperature compensation factor is associated with a quality factor; and a temperature sensing device coupled to the computation engine for sensing the temperature of the receiver;

wherein the computation engine is configured to correlate the temperature of the receiver with a subset of the temperature compensation factors to produce a current temperature compensation factor for adjusting the frequency of the reference oscillator, the computation engine being further configured to adjust the subset according to the frequency offset if the received signal's quality factor exceeds the quality factor associated with the subset.

21. The receiver of claim 20, further comprising:

a mixer for mixing a signal whose frequency is proportional to the reference signal with a transmitted signal to produce the received signal.

22. A frequency generator circuit comprising:

a crystal oscillator having an input to accept an oscillator correction signal and an output to supply a frequency responsive to the oscillator correction signal;

a summing circuit having an input to accept a reference signal, an input to accept a current correction factor signal, and an output to supply the oscillator correction signal; and a computation engine having an input to accept the reference signal and an input to accept stored correction information, the computation engine calculating a quality factor associated with the reference signal and supplying the current correction factor signal responsive to the quality factor calculation and the stored correction information.

23. The circuit of claim 22 further comprising:

a memory to supply the stored correction information and associated quality factors to the computation engine; and wherein the computation engine supplies the current correction factor signal in response to comparing the quality factor of the reference signal to the quality factor of the stored correction information.

24. The circuit of claim 23 wherein the computation engine generates modified correction information if the quality factor of the reference signal exceeds a threshold; and wherein the memory stores the modified correction information and associated quality factor.

25. The circuit of claim 23 wherein the computation engine degrades the quality factor associated with the stored correction information responsive to the length of time the information has been stored.

* * * * *